United States Patent [19]

Schädeli

[11] Patent Number: 5,274,060
[45] Date of Patent: Dec. 28, 1993

[54] COPOLYMERS CROSSLINKABLE BY ACID CATALYSIS

[75] Inventor: Ulrich Schädeli, Plasselb, Switzerland

[73] Assignee: Ciba-Geigy Corporation, Ardsley, N.Y.

[21] Appl. No.: 843,798

[22] Filed: Feb. 27, 1992

[30] Foreign Application Priority Data

Mar. 1, 1991 [CH] Switzerland .............. 624/91

[51] Int. Cl.$^5$ .................. C08F 224/00; C08F 216/38
[52] U.S. Cl. .................... 526/270; 526/266; 526/313; 526/284; 526/262; 526/314; 526/292.5; 526/292.6; 526/292.7; 526/297.8; 526/292.9; 526/292.95; 526/293; 526/297; 526/307.5; 526/271
[58] Field of Search .............. 526/262, 266, 270, 313

[56] References Cited

U.S. PATENT DOCUMENTS

| | | | |
|---|---|---|---|
| 3,063,975 | 11/1962 | Abramo et al. | 260/803 |
| 3,779,778 | 12/1973 | Smith et al. | 96/115 |
| 4,205,151 | 5/1980 | Dale et al. | 526/262 |
| 4,225,689 | 10/1980 | Wilson | 526/75 |
| 4,247,611 | 11/1981 | Sander et al. | 430/286 |
| 4,439,517 | 3/1984 | Irving | 430/328 |
| 4,618,564 | 10/1986 | Demmer et al. | 430/270 |
| 4,737,426 | 4/1988 | Roth | 430/17 |
| 4,800,152 | 1/1989 | Allen et al. | 430/270 |
| 4,954,592 | 9/1990 | Kaschig | 526/265 |

FOREIGN PATENT DOCUMENTS 0318649 6/1989 European Pat. Off. .
1539192 1/1979 United Kingdom .

OTHER PUBLICATIONS

Microelectronic Engineering, 11, (1990) 487-490 (Matzalsik, M et al).
Polym. Mat. Sci. Eng. 60, 1989, 147-150 (Fréchet J M J et al).
Polymer Engineering and Science, Jul. 1989, vol. 29, No. 14, pp. 960-964 (Beck, B et al).
Polymer Syntheses, vol. 1, 1974, pp. 3-17 (Sandler, S R et al).
Macromolecules 1991, vol. 24, 1746-1754 (Fréchet et al).
Abstract of Japanese 61-100745.
Abstract of Japanese 62-69262.

Primary Examiner—Joseph L. Schofer
Assistant Examiner—Mark Nagumo
Attorney, Agent, or Firm—William A. Teoli, Jr.

[57] ABSTRACT

Copolymers having a molecular weight (Mw) of from $10^3$ to $10^6$, measured by gel-permeation chromatography, that are crosslinkable by acid catalysis and that consist of a) 100–80 mol. % of structural repeating units of formulae I and II

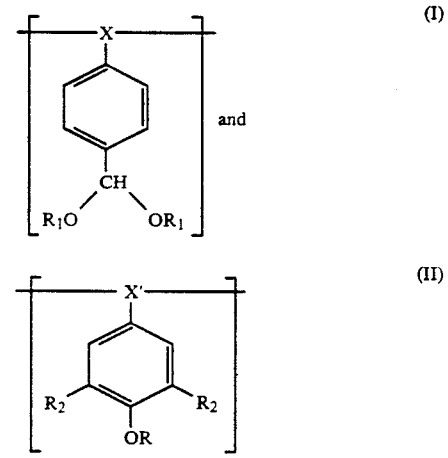

in a ratio of from 1:1 to 1:9 and b) 0–20 mol. % of structural repeating units of formula III (Abstract continued on next page.)

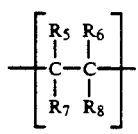

(III)

wherein X and X' each independently of the other are

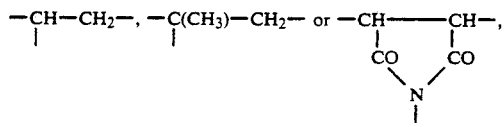

R is hydrogen or a protecting group that can be removed by the action of acids, the radicals $R_1$ each independently of the other are $C_1$-$C_5$alkyl, phenyl or naphthyl or together are 1,2-phenylene or $-[C(R_3)(R_4)]_x-$ wherein $R_3$ and/or $R_4$=hydrogen or methyl and x is from 2 to 5, the radicals $R_2$ each independently of the other are hydrogen, $C_1$-$C_5$alkyl or $C_1$-$C_5$alkoxy, $R_5$ and $R_7$ are each hydrogen, $R_6$ is hydrogen, halogen or methyl and $R_8$ is hydrogen, halogen, methyl, $-CH_2$halogen, $-CH_2CN$, $-CN$, $-COOH$, $-CONH_2$, $-O-C_1$-$C_5$alkyl, $-O-CO-C_1$-$C_5$alkyl, $-COO-C_1$-$C_5$alkyl, $-COO$-phenyl or phenyl, or $R_5$ and $R_6$ are each hydrogen and $R_7$ and $R_8$ together are $-CO-O-CO-$ or each independently of the other are $-COOH$ or $-COO-C_1$-$C_5$alkyl, are described.

The said copolymers are suitable, together with compounds that form an acid under actinic radiation, for the production of negative resist systems.

7 Claims, No Drawings

COPOLYMERS CROSSLINKABLE BY ACID CATALYSIS

The present invention relates to copolymers of acetalised and OH-group-containing vinylbenzenes or N-phenylmaleimides that are crosslinkable by acid catalysis, to photosensitive compositions comprising such copolymers and an acid-forming substance, and to the use thereof as negative resists for the production of protective coatings and relief structures.

Negative resist compositions that work according to the so-called chemical amplification principle are known from the literature. For example, J. M. F. Fréchet et al. describe in Polym. Mat. Sci. Eng., 60 (1989) 147-150, in Macromolecules, 24 (1991) 1746-1754 or in Polymer Engineering and Science, 29 No. 14 (July 1989) 960-964 negative resists of the amplification type based on electrophilic aromatic substitution. In that case, copolymers are produced from 4-tert-butoxycarbonylstyrene and 4-acetoxymethylstyrene and, after removal of the tert-butoxycarbonyl protecting groups, those copolymers are irradiated with UV light at 254 nm in the presence of a triarylsulfonium salt as acid generator, such as triphenylsulfonium hexafluoroantimonate, the irradiated areas becoming crosslinked. Instead of the said mixtures of copolymer and acid-generating triarylsulfonium salt, it is also possible to use 3-component systems consisting of polyfunctional low-molecular-weight latent electrophiles, such as 1,4-bis(acetoxymethyl)benzene, a triarylsulfonium salt and a phenolic polymer. Similar negative resist systems based on onium salts, a polyfunctional compound having activated aromatic rings and a polyfunctional compound supplying carbonium ions, at least one of those two compounds being a polymer or copolymer, are described in U.S. Pat. No. 4,800,152. M Hatzakis et al. describe in Microelectronic Engineering, 11 (1990) 487-490 negative resist compositions based on epoxidised novolaks and onium salts as acid-generating substances. These latter systems cannot be developed in an aqueous-alkaline medium.

On the other hand, it is known that acid-cleavable monomeric or polymeric acetals and ketals together with photoactivatable acid-forming compounds and, where appropriate, binders are suitable for the production of positive photoresist systems (see, for example, DE-A 27 18 254, U.S. Pat. No. 3,779,778 and EP-A 0 202 196).

It has now been found that, surprisingly, certain copolymers of acetalised and OH-group-containing vinylbenzenes or N-phenylmaleimides are suitable for the production of negative resist systems that work according to the chemical amplification principle.

The invention relates, therefore, to copolymers having a molecular weight (Mw) of from $10^3$ to $10^6$, measured by gel-permeation chromatography, that are crosslinkable by acid catalysis and that consist of a) 100-80 mol. % of structural repeating units of formulae I and II

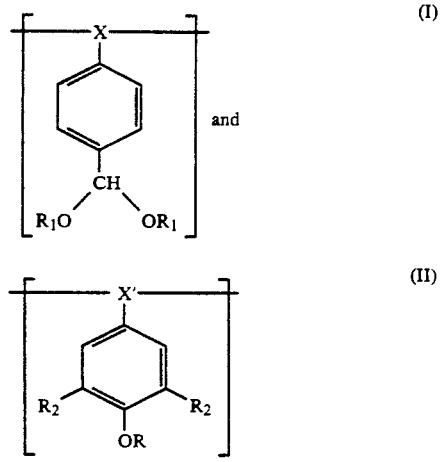

in a ratio of from 1:1 to 1:9, preferably from 1:2 to 1:4, and b) 0-20 mol. % of structural repeating units of formula III

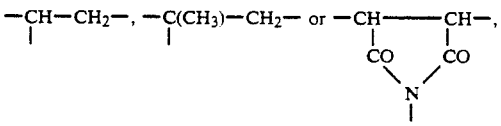

wherein X and X' each independently of the other are

—CH—CH$_2$—, —C(CH$_3$)—CH$_2$— or —CH———CH—,
                                            CO    CO
                                                 \  /
                                                   N
                                                   |

R is hydrogen or a protecting group that can be removed by the action of acids, the radicals $R_1$ each independently of the other are $C_1$-$C_5$alkyl, phenyl or naphthyl or together are 1,2-phenylene or —[C($R_3$)($R_4$)]$_x$— wherein $R_3$ and/or $R_4$=hydrogen or methyl and x is from 2 to 5, especially from 2 to 4, the radicals $R_2$ each independently of the other are hydrogen, $C_1$-$C_5$alkyl or $C_1$-$C_5$alkoxy, $R_5$ and $R_7$ are each hydrogen, $R_6$ is hydrogen, halogen or methyl and $R_8$ is hydrogen, halogen, methyl, —CH$_2$halogen, —CH$_2$CN, —CN, —COOH, —CONH$_2$, —O—$C_1$-$C_5$alkyl, —O—CO—$C_1$-$C_5$alkyl, —COO—$C_1$-$C_5$alkyl, —COO-phenyl or phenyl, or $R_5$ and $R_6$ are each hydrogen and $R_7$ and $R_8$ together are —CO—O—CO— or each independently of the other are —COOH or —COO—$C_1$-$C_5$alkyl.

The copolymers according to the invention preferably have a molecular weight (Mw) of from 5000 to 500,000, especially from 5000 to 20,000.

There are furthermore preferred copolymers in which the proportion of structural repeating units of formulae I and II is from 100 to 90 mol. % and that of structural units of formula III is from 0 to 10 mol. %.

X and X' are preferably

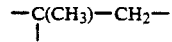

and, especially, are each

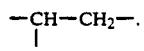

Examples of protecting groups R that can be removed by the action of acids are radicals of formulae IV to VII

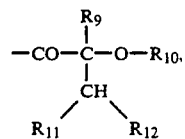

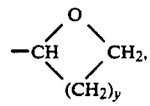

—COO—C(CH$_3$)$_3$ (VI) and —CO—R$_{13}$ (VII), wherein R$_9$ is hydrogen or methyl, R$_{10}$ is C$_1$-C$_5$alkyl, phenyl or naphthyl and R$_{11}$ and R$_{12}$ each independently of the other are hydrogen, C$_1$-C$_5$alkyl, phenyl or naphthyl, or R$_{10}$ and R$_{12}$ together are ethylene, propylene or butylene each unsubstituted or substituted by C$_1$-C$_4$alkyl, C$_1$-C$_4$alkoxy, phenyl, naphthyl, phenoxy or by naphthyloxy, y is 2, 3 or 4, and R$_{13}$ is C$_1$-C$_5$alkyl or C$_1$-C$_5$alkoxy.

Alkyl groups represented by R$_1$, R$_2$, R$_{10}$, R$_{11}$, R$_{12}$ or R$_{13}$ or present in radicals R$_8$, R$_{10}$ and R$_{12}$, and alkoxy groups R$_2$ and R$_{13}$ or alkoxy groups present in radicals R$_{10}$ or R$_{12}$ may be straight-chained or branched. Examples that may be mentioned are: methyl, ethyl, n-propyl, isopropyl, n-, sec- and tert-butyl, n-pentyl, methoxy, ethoxy, n-propoxy, isopropoxy, n- and tert-butoxy and n-pentyloxy. R$_1$, R$_2$, R$_{10}$, R$_{11}$ and R$_{12}$ as alkyl or alkoxy are especially methyl, ethyl, methoxy or ethoxy, more especially methyl or methoxy. Halogen in groups R$_6$ and R$_8$ is e.g. Cl, Br or F.

The two radicals R$_1$ are preferably —[C(R$_3$)(R$_4$)]$_x$— wherein x is from 2 to 4, especially 2 or 3. The radicals R$_2$ are preferably hydrogen.

In preferred radicals of formula IV, R$_9$ has the meaning given above, R$_{10}$ is methyl or ethyl, R$_{11}$ and R$_{12}$ each independently of the other are hydrogen or methyl, or R$_{10}$ and R$_{12}$ together are unsubstituted ethylene or propylene. y in radicals of formula V is preferably 2 or 3, and in radicals of formula VII R$_{13}$ is especially C$_1$-C$_5$alkoxy, more especially tert-butoxy.

R is preferably hydrogen or —COO—C(CH$_3$)$_3$ and is especially a radical of formula V wherein y is 2 and especially 3. Most preferably, R is hydrogen.

The copolymers according to the invention can be prepared in a manner known per se by radical copolymerisation of 100-80 mol. % of compounds of formulae Ia and IIa

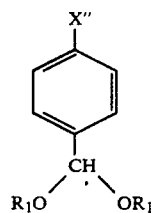

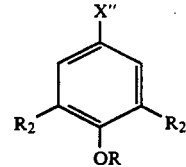

in a ratio of from 1:1 to 1:9 and 0-20 mol. % of a compound of formula IIIa

wherein R, R$_1$, R$_2$ and R$_5$ to R$_8$ are as defined above and X" is

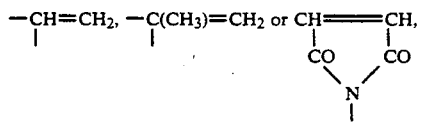

and, if desired, acid-catalysed removal of the protecting group R.

It is often advantageous to use for the copolymerisation compounds of formula IIa wherein R is a protective group that can be removed by the action of acids. It is also not necessary to remove the protective group R before using the copolymers according to the invention in negative resist systems. Preferably, that removal is effected in the presence of a compound that forms an acid under actinic radiation.

The radical copolymerisation can be carried out using various techniques. These have been described, for example, by S. Sandler and W. Karo in "Polymer Synthesis", vol. 1-3, 1968, Academic Press, New York. Customary polymerisation methods are, for example, mass polymerisation, solvent polymerisation, emulsion polymerisation, suspension polymerisation or precipitation polymerisation.

The starting materials of formula Ia are known or can be prepared according to methods known per se, for example by reaction of the corresponding benzaldehydes with pyrocatechol, mono- or di-hydroxy compounds R$_1$OH or HO—[C(R$_3$)(R$_4$)]$_x$—OH.

The compounds of formula IIa wherein R=H are in most cases known or can be prepared according to methods known per se. Compounds of formula IIa wherein R is a protective group as defined herein can be obtained by reaction of the corresponding compounds of formula IIa wherein R=H with compounds of formulae IVa to VIIa

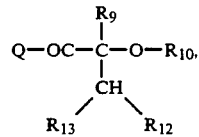

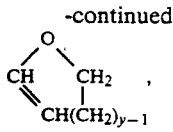  (Va)

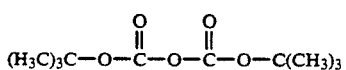  (VIa)

and Q—CO—$R_{13}$ (VIIa), wherein Q is a reactive group, for example —Cl.

The compounds of formula IIIa are also known and some of them are available commercially. Examples of monomers of formula IIIa are ethylene, propylene, styrene, α-methylstyrene, acrylonitrile, α,β-unsaturated acids and amides, such as, for example, acrylic acid, acrylic acid methyl ester and acrylic acid amide and the corresponding methacrylic acid compounds, maleic acid, maleic acid methyl ester, maleic acid dimethyl and diethyl ester, halogenated vinyl compounds, such as, for example, vinyl chloride, vinyl fluoride, vinylidene chloride or vinylidene fluoride, vinyl esters and vinyl ethers, such as, for example, vinyl acetate, methyl vinyl ether and butyl vinyl ether. Other suitable compounds are, for example, allyl bromide, allyl chloride and allyl cyanide.

The polymerisation is normally initiated by one of the customary initiators of free-radical polymerisation. The latter include thermal initiators, such as azo compounds, for example α,α'-azoisobutyronitrile (AIBN), or peroxides, for example benzoyl peroxide, or redox initiator systems, such as a mixture of iron(III) acetyl acetonate, benzoin and benzoyl peroxide, or photochemical free-radical formers, such as benzoin or benzildimethyl ketal.

The polymerisation is preferably carried out in solution. The reaction temperature generally varies within a range of from 10° to 200° C., preferably from 40° to 150° C., most preferably from 40° to 100° C.

Any solvents that may be present must be inert under the reaction conditions. Suitable solvents are inter alia aromatic hydrocarbons, chlorinated hydrocarbons, ketones and ethers. Examples of these are: benzene, toluene, xylenes, ethylbenzene, isopropylbenzene, ethylene chloride, propylene chloride, methylene chloride, chloroform, methyl ethyl ketone, acetone, cyclohexanone, diethyl ether and tetrahydrofuran.

The copolymers according to the invention are suitable for the preparation of highly sensitive negative resist compositions that can be developed in an aqueous-alkaline medium.

The invention also relates, therefore, to photosensitive compositions comprising
i) at least one copolymer as defined and
ii) at least one compound that forms an acid under actinic radiation.

The acid formed in the irradiated regions catalyses the crosslinking of the copolymer while removing any protecting groups R present. Preferred copolymers i) have been described in the foregoing.

Examples of suitable compounds that form an acid under actinic radiation are:

Suitable compounds ii) that form an acid under actinic radiation are especially onium salts, such as diazonium, sulfonium, sulfoxonium and iodonium salts. Preferred are sulfonium salts of formula VIII

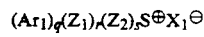  (VIII), wherein $Ar_1$ is phenyl, naphthyl or phenyl—$COCH_2$— each unsubstituted or substituted by halogen, $C_1$-$C_4$alkyl, $C_1$-$C_4$alkoxy, —OH and/or by nitro, $Z_1$ is $C_1$-$C_6$alkyl or $C_3$-$C_7$cycloalkyl and $Z_2$ is tetrahydrothienyl, tetrahydrofuryl or hexahydropyryl, q is 0, 1, 2 or 3, r is 0, 1 or 2 and s is 0 or 1, the sum of q+r+s being 3, and $X_1^\ominus$ is chloride, bromide or iodide anion, $BF_4^\ominus$, $PF_6^\ominus$, $AsF_6^\ominus$, $SbF_6^\ominus$, $FSO^\ominus$ or the anion of an organic sulfonic or carboxylic acid.

Phenyl, naphthyl and phenacyl groups $Ar_1$ are preferably mono-substituted, especially by Cl, Br, methyl, methoxy, —OH or nitro. Most preferably, these radicals are unsubstituted. $Z_1$ is preferably $C_1$-$C_4$alkyl, especially methyl or ethyl. Preferably, q is 2 or 3, r is 1 or zero and s is zero, and, especially, q is 3 and r and s are zero. Most preferably, $Ar_1$ is unsubstituted phenyl and q is 3.

When $X_1^\ominus$ is the anion of an organic sulfonic or carboxylic acid, it may be an anion of an aliphatic, cycloaliphatic, carbocyclic-aromatic, heterocyclic-aromatic or araliphatic sulfonic or carboxylic acid. These anions may be substituted or unsubstituted. Preferred are only weakly nucleophilic sulfonic and carboxylic acids, for example partially fluorinated or perfluorinated derivatives or derivatives that are substituted in a position adjacent to the respective acid group. Examples of substituents are halogen, such as chlorine and especially fluorine, alkyl, such as methyl, ethyl or n-propyl, or alkoxy, such as methoxy, ethoxy or n-propoxy.

Examples of aliphatic sulfonic acids are methane-, ethane-, n-propane-, n-butane- and n-hexane-sulfonic acid or the corresponding partially fluorinated or perfluorinated derivatives thereof.

Examples of aliphatic carboxylic acids are formic acid, acetic acid, propionic acid, butyric acid, pivalic acid, caproic acid, 2-ethylhexylcarboxylic acid and fatty acids, such as lauric acid, myristic acid or stearic acid, and the partially fluorinated or perfluorinated derivatives of those acids.

Examples of cycloaliphatic sulfonic and carboxylic acids are cyclohexanesulfonic acid, cyclohexanecarboxylic acid, camphor-10-sulfonic acid or the partially fluorinated or perfluorinated derivatives thereof.

Examples of carbocyclic-aromatic sulfonic acids are benzene-, toluene-, ethylbenzene-, isopropylbenzene-, dodecylbenzene- or dimethylbenzene-sulfonic acid, 2,4,6-triisopropylbenzenesulfonic acid, 2,4,6-trimethylbenzenesulfonic acid, naphthalenemono-, -di- or -tri-sulfonic acids, and the corresponding alkylated or partially fluorinated or perfluorinated derivatives of those sulfonic acids.

Examples of heterocyclic-aromatic sulfonic acids are pyridine-, thiophene- or pyrrole-sulfonic acid and the corresponding partially fluorinated or perfluorinated derivatives of those acids.

Examples of araliphatic sulfonic acids are benzylsulfonic acid, α-methylbenzylsulfonic acid and the corresponding partially fluorinated or perfluorinated derivatives of those compounds.

Examples of carbocyclic-aromatic carboxylic acids are benzoic acid, toluene-, ethylbenzene-, isopropylbenzene- or dimethylbenzene-carboxylic acid, naphthalenecarboxylic acid or anthracenecarboxylic acid and the corresponding partially fluorinated or perfluorinated derivatives of those compounds.

Examples of heterocyclic-aromatic carboxylic acids are pyridine-, thiophene-or pyrrole-carboxylic acid and the corresponding partially fluorinated or perfluorinated derivatives of those compounds.

Examples of araliphatic carboxylic acids are benzylcarboxylic acid, α-methylbenzylcarboxylic acid and cinnamic acid, and the corresponding partially fluorinated or perfluorinated derivatives of those compounds.

$X_1^\ominus$ is preferably the mono-valent anion of an organic sulfonic acid, especially a partially fluorinated or perfluorinated sulfonic acid. These anions are distinguished by being especially weakly nucleophilic.

Specific examples of suitable sulfonium salts of formula VIII are triphenylsulfonium bromide, triphenylsulfonium chloride, triphenylsulfonium iodide, triphenylsulfonium hexafluorophosphate, triphenylsulfonium hexafluoroantimonate, triphenylsulfonium hexafluoroarsenate, triphenylsulfonium trifluoromethanesulfonate, diphenylethylsulfonium chloride, phenacyldimethylsulfonium chloride, phenacyltetrahydrothiophenium chloride, 4-nitrophenacyltetrahydrothiophenium chloride and 4-hydroxy-2-methylphenylhexahydrothiopyrylium chloride. Triphenylsulfonium trifluoromethanesulfonate is especially preferred.

It is also possible to use as compounds ii) iodonium salts of formula IX

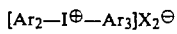   (IX)

wherein $Ar_2$ and $Ar_3$ each independently of the other are phenyl or naphthyl each unsubstituted or substituted by $C_1$-$C_4$alkyl, $C_1$-$C_4$alkoxy, halogen and/or by nitro, or $Ar_2$ and $Ar_3$ together are a group of formula X

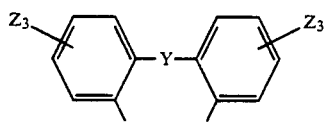   (X)

wherein $Z_3$ is $C_1$-$C_4$alkyl, $C_1$-$C_4$alkoxy, halogen or nitro and Y is a direct bond, —O—, —$CH_2$— or —CO— and $X_2^\ominus$ is a chloride, bromide or iodide anion. Iodonium salts of formula IX are described, for example, in GB-A 1 539 192.

Also suitable as compounds ii) are substances of formulae XI to XVII that produce sulfonic acid under actinic radiation

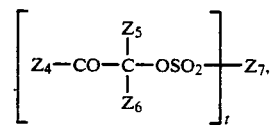   (XI)

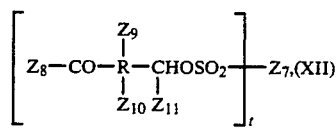   (XII)

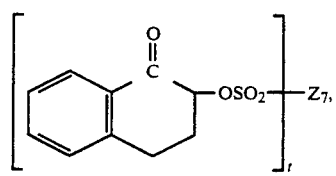   (XIII)

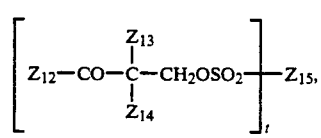   (XIV)

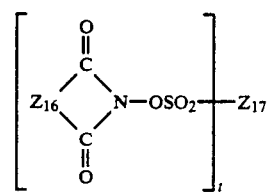   (XV)

$[Z_{18}CON(Z_{14})-OSO_2]_t Z_{17}$   (XVI)

and

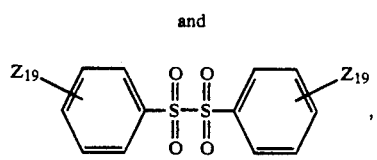   (XVII)

wherein t is 1 or 2, preferably 1, $Z_4$ is phenyl or naphthyl each unsubstituted or substituted by from 1 to 3 —Cl, —Br, —CN, —$NO_2$, $C_1$-$C_4$alkyl, $C_1$-$C_4$alkoxy, $C_1$-$C_4$alkylthio, phenoxy, phenylthio, $C_1$-$C_4$alkylamino, $C_2$-$C_4$dialkylamino or benzoyl substituents, especially unsubstituted phenyl or phenyl mono-substituted by —Cl, methyl or by methoxy, $Z_5$ is hydrogen or $C_1$-$C_4$alkyl and $Z_6$ is hydrogen, $C_1$-$C_4$alkyl or phenyl, or $Z_5$ and $Z_6$ together with the linking carbon atom form a cyclopentane or cyclohexane ring, $Z_7$, when t=1, is $C_1$-$C_{18}$alkyl, phenyl or naphthyl each unsubstituted or substituted by $C_1$-$C_4$alkyl, or cyclopentyl, cyclohexyl or camphoryl and, when t=2, is $C_2$-$C_8$alkylene or phenylene, $Z_8$ is phenyl or naphthyl each unsubstituted or substituted by from 1 to 3 —Cl, —Br, $C_1$-$C_4$alkyl, $C_1$-$C_4$alkoxy, $C_1$-$C_4$alkylthio, phenyl, phenoxy, phenylthio, $C_1$-$C_4$alkyl-CONH—, benzoylamino or dimethylamino substituents, especially unsubstituted phenyl or phenyl monosubstituted by —Cl, $C_1$-$C_4$alkoxy, methylthio or by phenyl, $Z_9$ is —OH or $C_1$-$C_4$alkyl, $Z_{10}$ is $C_1$-$C_4$alkyl or phenyl, $Z_{11}$ is hydrogen, $C_1$-$C_4$alkyl, furyl or —$CCl_3$ or $Z_{10}$ and $Z_{11}$ together with the linking carbon atom form a cyclopentane or cyclohexane ring, $Z_{12}$ and $Z_{13}$ each independently of the other are phenyl unsubstituted or substituted by halogen, $C_1$-$C_4$alkyl or by $C_1$-$C_4$alkoxy, $Z_{14}$ is hydrogen or $C_1$-$C_4$alkyl, $Z_{15}$, when t is 1, is $C_1$-$C_6$alkyl, phenyl, naphthyl or benzyl and, when t=2, is $C_1$-$C_6$alkylene, phenylene or xylylene, $Z_{16}$ is phenylene or naphthylene each unsubstituted or substituted by halogen, nitro, $C_1$-$C_4$alkyl, $C_1$-$C_4$alkoxy or by $C_1$-$C_4$alkylthio or is —CH=CH—, $Z_{17}$, when t=1, is $C_1$-$C_{12}$alkyl, or phenyl unsubstituted or substituted by halogen, nitro, $C_1$-$C_4$alkyl or by $C_1$-$C_4$alkoxy and, when t=2, is $C_2$-$C_8$alkylene or phenylene, $Z_{18}$ is phenyl or naphthyl each unsubstituted or substituted by halogen, nitro, —CN, $C_1$-$C_4$alkyl, methoxy, ethoxy, dimethylamino or by benzoyl, and the radicals $Z_{19}$ each independently of the other are $C_1$-$C_4$alkyl.

Alkyl, alkoxy, alkylthio, alkylamino, dialkylamino, alkylcarbamoyl and alkylene groups according to the definition may be straight-chain or branched, but are preferably straight-chain. Halogen is especially —Cl or —Br.

Compounds of formulae XI to XVI are described, for example, in EP-A 0 166 682 and 0 085 024 and in the literature referred to therein. Especially preferred compounds of formulae XI to XVI are phenacyl p-methylbenzenesulfonate, benzoin p-toluenesulfonate, 3-(p-toluenesulfonyloxy)-2-hydroxy-2-phenyl-1-phenyl-1-propanone [α-(p-toluenesulfonyloxy)methylbenzoin], N-(p-dodecylbenzenesulfonyloxy)-1,8-naphthalimide and N-(phenylsulfonyloxy)-1,8-naphthalimide.

Other suitable compounds ii) are o-nitrobenzaldehydes that are rearranged under actinic radiation to form o-nitrosobenzoic acids, such as 1-nitrobenzaldehyde and 2,6-dinitrobenzaldehyde; α-haloacylphenones, such as α,α,α-trichloroacetophenone and p-tert-butyl-α,α,α-trichloroacetophenone, and sulfonic acid esters of o-hydroxyacylphenones, such as 2-hydroxybenzophenone methanesulfonate and 2,4-hydroxybenzophenone bis(methanesulfonate).

Finally, there are also suitable as compounds ii) those which contain aromatically bonded chlorine or bromine, as are described, for example, in EP-A 0 318 649, for example compounds of formula XVIII

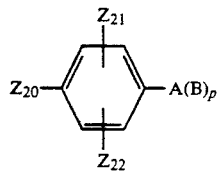

(XVIII)

having at least one aromatically bonded chlorine or bromine atom, wherein, for example, p is 0 or 1, $Z_{20}$ is —COOH, —$OZ_{23}$ or —$SZ_{23}$, $Z_{21}$ and $Z_{22}$ each independently of the other are hydrogen, —Cl, —Br, alkyl unsubstituted or substituted by aryl, alkoxy, aryloxy, —OH or by —F, or aryl unsubstituted or substituted by alkoxy, aryloxy, —OH or by halogen, $Z_{23}$ is hydrogen, alkyl or aryl each unsubstituted or substituted analogously to $Z_{21}$ or is acyl, A, when p=0, is hydrogen, —Cl, —Br, or alkyl unsubstituted or substituted analogously to $Z_{21}$ and, when p=1, is —$SO_2$—, propylene or perfluoroalkylene and B is a group

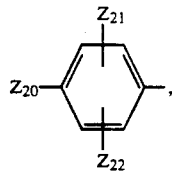

alkylcarbonyl, alkoxycarbonyl or substituted sulfonylimidocarbonyl. Examples of such compounds are hexafluorotetrabromobisphenol A, 1,1,1-tris(3,5-dibromo-4-hydroxyphenyl)ethane and N-(2,4,6-tribromophenyl)-N'-(p-toluenesulfonyl)urea.

It is especially preferred to use as compounds ii) those of formula VIII wherein $Ar_1$ is phenyl, q is the number 3, r and s are zero, and $X_1^\ominus$ is $SbF_6^\ominus$, $AsF_6^\ominus$, $PF_6^\ominus$ and especially the anion of an aliphatic, partially fluorinated aliphatic or perfluorinated aliphatic sulfonic acid or of an aromatic, partially fluorinated aromatic or perfluorinated aromatic sulfonic acid. Especially preferred anions $X_1^\ominus$ are $CF_3SO_3^\ominus$, $C_2F_5SO_3^\ominus$, n-$C_3F_7SO_3^\ominus$, $C_4F_9SO_3^\ominus$, n-$C_6F_{13}SO_3^\ominus$, n-$C_8F_{17}SO_3^\ominus$ and $C_6F_5SO_3^\ominus$. There is most preferably used as compound ii) triphenylsulfonium trifluoromethanesulfonate.

The compounds ii) are advantageously employed in an amount of from 0.1 to 20% by weight, especially from 1 to 10% by weight and most especially from 1 to 6% by weight, based on the weight of the copolymer.

The compositions according to the invention may comprise other customary additives, such as e.g. binders, stabilisers, pigments, dyes, fillers, adhesion promoters, leveling agents, wetting agents and plasticisers. The compositions are preferably dissolved in suitable solvents [component iii)] for application.

The binder is selected in accordance with the field of application and the properties required for that field of application. Suitable binders are, for example, novolaks derived from an aldehyde, preferably formaldehyde, acetaldehyde or furfuraldehyde, but especially formaldehyde, and a phenol. The phenolic component of these binders is preferably phenol itself or, alternatively, halogenated phenol, for example phenol substituted by one or two chlorine atoms, preferably p-chlorophenol, or it is a phenol substituted by one or two $C_1$-$C_9$alkyl groups, for example o-, m-or p-cresol, a xylenol, p-tert-butylphenol or p-nonylphenol. The phenol component of the preferred novolaks may, however, also be p-phenylphenol, resorcinol, bis(4-hydroxyphenyl)methane or 2,2-bis(4-hydroxyphenyl)propane.

Other suitable binders are, for example, copolymers of maleic anhydride with styrene, vinyl ethers or 1-alkenes. Homo- or co-polymeric acrylates and methacrylates, for example copolymers of methyl methacrylate/ethyl acrylate/methacrylic acid, poly(methacrylic acid alkyl esters) or poly(acrylic acid alkyl esters) containing, for example, from 1 to 20 carbon atoms in the alkyl radical, can also be used as binders.

There is preferably used as binder an alkali-soluble substance, for example a novolak (which may be modified as described above), poly(4-hydroxystyrene) or poly(4-hydroxy-3,5-dimethylstyrene), copolymers of maleic anhydride with styrene, vinyl ethers or 1-alkenes, and copolymers of acrylic or methacrylic acid esters with ethylenically unsaturated acids, for example methacrylic acid or acrylic acid.

The photosensitive compositions according to the invention, dissolved in a solvent or mixture of solvents, are eminently suitable as coating compositions for substrates of all kinds, for example wood, textiles, paper, ceramics, glass, plastics, such as polyesters, polyethylene terephthalate, polyolefins or cellulose acetate, especially in the form of films, and metals, such as Al, Cu, Ni, Fe, Zn, Mg or Co, and GaAs, Si or $SiO_2$, to which an image is to be applied by image-wise exposure.

The choice of solvent and the concentration are governed primarily by the nature of the composition and the coating method. The solvent should be inert, i.e. it should not undergo chemical reaction with the components, and it should be capable of being removed again during drying after the coating operation. Suitable solvents are, for example, ketones, ethers and esters, such as methyl ethyl ketone, isobutyl methyl ketone, cyclopentanone, cyclohexanone, N-methylpyrrolidone, dioxane, tetrahydrofuran, 2-methoxyethanol, 2-ethoxyethanol, 1-methoxy-2-propanol, 1,2-dimethoxyethane, ethyl acetate, n-butyl acetate and ethyl 3-ethoxypropionate.

The solution is uniformly applied to a substrate by known coating methods, for example by spin-coating, dip-coating, doctor coating, curtain coating methods, brushing, spraying, especially by electrostatic spraying and reverse roll coating. It is also possible to apply the photosensitive layer to a temporary, flexible carrier and then to coat the final substrate, for example a copper-clad circuit board, by layer transfer via lamination.

The quantity applied (coating thickness) and the type of substrate (coating carrier) depend upon the desired field of application. The coating thickness range generally encompasses values of approximately from 0.1 μm to more than 10 μm.

The photosensitive compositions according to the invention are used as negative resists that have a very high sensitivity to light and that can be developed in an aqueous-alkaline medium without swelling. They are suitable as photoresists for electronics (electroplating resist, etching resist, solder resist), for the manufacture of printing plates, such as offset printing plates or screen printing blocks, for use in the etching of mouldings or for use as a microresist in the manufacture of integrated circuits. The possible coating substrates and the processing conditions of the coated substrates are correspondingly varied.

For recording photographic information there are used, for example, films of polyester, cellulose acetate or plastics-coated papers; for offset printing moulds specially treated aluminium, for the manufacture of printed circuits copper-clad laminates and, for the manufacture of integrated circuits, silicon wafers. The coating thicknesses for photographic materials and offset printing blocks are normally approximately from 0.5 μm to 10 μm and, for printed circuits, from 0.4 to approximately 2 μm.

Using the compositions according to the invention, it is possible to produce high-resolution relief structures of negative tonality. Owing to the high sensitivity and the high optical transparency or, in other words, the low optical absorption in the UV range around 250 nm, they are especially suitable for microlithography applications, especially deep UV microlithography. Owing to those properties, very steep wall profiles can be obtained and the resolution of submicron structures (down to 0.5 μm) can be achieved. Such submicron structures cannot be produced, for example, with corresponding compositions containing an acetoxymethyl function in the copolymer molecule.

After coating of the substrates, the solvent is generally removed by drying, producing a layer of photoresist on the carrier.

The expression "image-wise" exposure includes exposure through a photomask containing a predetermined pattern, for example a diapositive, exposure by a laser beam which is moved over the surface of the coated substrate, for example by computer control to produce an image, and irradiation with computer-controlled electron beams.

The photosensitivity of the compositions according to the invention generally extends from the UV region (approximately 200 nm) to approximately 600 nm and thus spans a very broad range. Therefore, a large number of very different light sources are employed. Both point sources and arrays of reflector lamps are suitable. Examples are carbon arc lamps, xenon arc lamps, mercury vapour lamps, which may be doped with metal halides (metal halide lamps), fluorescent lamps, argon glow lamps, electronic flash lamps, photographic flood lamps, electron beams and X-rays produced by means of synchrotrons or laser plasma. The distance between the lamp and the image material according to the invention may vary, for example between 2 cm and 150 cm, according to the utility and the type and intensity of the lamp. Laser light sources, for example excimer lasers, such as krypton fluoride lasers, for exposure at 248 nm are especially suitable. The high sensitivity of the materials according to the invention is very advantageous in this connection. By this method it is possible to produce printed circuits in the electronics industry, lithographic offset printing plates or relief printing plates and photographic image-recording materials.

After the image-wise exposure of the material and before developing, it may be advantageous to carry out thermal treatment for a relatively brief period. In that treatment, only the exposed parts are thermally cured. The temperatures used are generally from 50° to 150° C., preferably from 80° to 130° C.; the time for the thermal treatment is as a rule from 0.25 to 10 minutes.

After exposure and, if desired, thermal treatment, the unexposed areas of the photoresist are removed in a manner known per se using a developer.

As has already been mentioned, the compositions according to the invention can be developed in an aqueous-alkaline medium. Suitable aqueous-alkaline developer solutions are, especially, aqueous solutions of tetraalkylammonium hydroxides or of alkali metal silicates, phosphates, hydroxides and carbonates. Where appropriate, relatively small amounts of wetting agents and/or organic solvents may additionally be added to those solutions. Typical organic solvents that may be added in small amounts to the developer fluids are, for example, cyclohexanone, 2-ethoxyethanol, toluene, acetone and mixtures of such solvents.

The compositions according to the invention are especially suitable for the manufacture of printing plates, printed circuits and integrated circuits.

The following Examples illustrate the invention in detail.

EXAMPLE 1

Preparation of 4-vinylbenzaldehyde

In a 250 ml 3-necked round-bottomed flask equipped with reflux condenser, mechanical stirrer, internal thermometer and nitrogen delivery line, 18.4 g (133 mmol) of 4-chlorostyrene are slowly added dropwise to a mixture of 6.5 g (268 mmol) of magnesium chips in 100 ml of tetrahydrofuran (THF). The reaction mixture is maintained at 50° C. for 1 hour and then a solution of 9.8 g (134 mmol) of dimethylformamide in 50 ml of THF is added dropwise thereto. After 12 hours at room temperature, the mixture is poured onto ice and extracted with diethyl ether. The organic phase is washed twice with water, dried over magnesium sulfate and concentrated to yield 18.3 g of product in the form of a pale yellow oil. Purification by column chromatography (silica gel, hexane/diethyl ether 4:1) yields 12.6 g (95.3 mmol, 72% of the theoretical yield) of 4-vinylbenzaldehyde. $^1$H-NMR (CDCl$_3$, 100 mHz): δ9.95/s, 7.80/d (J=9 Hz), 7.49/d (J=9 Hz), 6.74/dd (J$_1$=18 Hz, J$_2$=11 Hz), 5.87dd (J$_1$=18 Hz, J$_2$=2 Hz), 5.39/dd (J$_1$=11 Hz, J$_2$=2 Hz).

EXAMPLE 2

Preparation of 2-(4-ethenylphenyl)-1,3-dioxolane

In a 250 ml 3-necked round-bottomed flask, 13.72 g of (103 mmol) of 4-vinylbenzaldehyde, 7.08 g (114 mmol) of ethylene glycol and 0.23 g (1.3 mmol) of p-toluenesulfonic acid are added to 100 ml of toluene. The resulting mixture is refluxed at 45° C. under reduced pressure for 3 hours using a water separator. It is then washed twice with 100 ml of water, and the organic phase is dried over magnesium sulfate and concentrated to yield 17.47 g of crude product in the form of a pale yellow oil. The latter is distilled at 80° C./0.05 mbar. Yield: 12.81 g (72.7 mmol, 70.6% of the theoretical yield). $^1$H-NMR (CDCl$_3$, 100 mHz): $\delta$7.39/s/4H, 6.68/dd (J$_1$=11 Hz, J$_2$=18 Hz)/1H, 5.74/s/1H, 5.72 (J$_1$=18 Hz, J$_2$=2 Hz)/1H, 5.22/dd (J$_1$=11 Hz, J$_2$=2 Hz)/1H, 3.96/m/4H.

EXAMPLE 3

Preparation of 4-hydroxystyrene

In a 1-liter sulfonating flask equipped with mechanical stirrer, reflux condenser and nitrogen delivery line, 300 ml of dimethyl sulfoxide are added to 150 g (0.91 mol) of 4-hydroxycinnamic acid, 6 g (54 mmol) of hydroquinone and 6 g (39 mmol) of 1,8-diazabicyclo[5.4.-0]undec-7-ene. The mixture is then heated at 135° C. for 3½ hours. After cooling, the mixture is poured onto ice and extracted three times with 500 ml of diethyl ether, and the organic phase is washed five times with 100 ml of water, dried over magnesium sulfate and concentrated. The resulting oil is recrystallised twice from n-hexane to yield 69.07 g (0.58 mol, 63% of the theoretical yield) of 4-hydroxystyrene in the form of a white powder (m.p. 68° C.).

$^1$H-NMR (CDCl$_3$, 100 mHz): $\delta$9.52/s/1H, 7.26/d (J=9 Hz)/2H, 6.69/d (J=9 Hz)/2H, 6.6/dd (J$_1$=18 Hz, J$_2$=12 Hz)/1H, 5.58/dd (J$_1$=18 Hz, J$_2$=2 Hz)/1H, 5.02/dd (J$_1$=12 Hz, J$_2$=2 Hz)/1H.

Elementary analysis: calculated: C 79.97%, H 6.71%; found: C 79.11%, H 6.82%.

EXAMPLE 4

Preparation of 4-tetrahydropyran-2-yloxystyrene

In a 250 ml round-bottomed flask, 15 g (125 mmol) of 4-hydroxystyrene and 0.4 g (2.3 mmol) of p-toluenesulfonic acid monohydrate are dissolved in 120 ml of diethyl ether. Then, at 5° C., 11.6 g (137 mmol) of 3,4-dihydro-2H-pyran are added dropwise over a period of 10 minutes. The mixture is allowed to reach room temperature and is further stirred for 20 hours. 1N NaOH solution is then added and the organic phase is washed twice with water, dried over magnesium sulfate and concentrated to yield 23.3 g (114 mmol, 90% of the theoretical yield) of 4-tetrahydropyran-2-yloxystyrene in the form of a colourless oil that can be used for the copolymerisation without being further purified. $^1$H-NMR (CDCl$_3$, 100 mHz): $\delta$7.37/d (J=9 Hz)/2H, 7.02/d (J=9 Hz)/2H, 6.52/dd (J$_1$=18 Hz, J$_2$=11 Hz)/1H, 5.50/dd (J$_1$=18 Hz, J$_2$=2 Hz)/1H, 5.41/m/1H, 5.11/dd (J$_1$=11 Hz, J$_2$=2 Hz)/1H, 4.0–3.7/m/1H, 3.7–3.4/m/1H, 2.2–1.2/m/6H.

Elementary analysis: calculated: C 76.44%, H 7.90%; found: C 74.81%, H 7.89%.

EXAMPLE 5

Preparation of 2-(4-ethenylphenyl)-1,3,5-dimethyldioxane

In a 250 ml 3-necked round-bottomed flask, 10.0 g (75.7 mmol) of 4-vinylbenzaldehyde, 8.67 g (83 mmol) of 2,2-dimethyl-1,3-propanediol and 0.15 g (0.9 mmol) of p-toluenesulfonic acid are added to 65 ml of toluene. The mixture is refluxed for 5 hours using a water separator and then 50 ml of 0.1N sodium hydroxide solution are added thereto. The organic phase is separated, washed three times with water, dried over magnesium sulfate and concentrated. The resulting crude product is recrystallised from methanol/water.

Yield: 10.9 g (45.8 mmol; 60.5% of the theoretical yield) in the form of white crystals.

Melting point: 45°–46° C.

$^1$H-NMR (CDCl$_3$, 100 MHz): $\delta$7.46/d/2H, 7.39/d/2H, 6.71/dd/1H, 5.75/d/1H, 5.38/s/1H, 5.24/d/1H, 3.77/d/2H, 3.64/d/2H, 1.29/s/3H, 0.80/s/3H.

EXAMPLE 6

Preparation of 4-ethenylphenyl-di-n-propoxymethane

In a 100 ml 3-necked round-bottomed flask, 6.8 g (51.5 mmol) of 4-vinylbenzaldehyde, 12.4 g (205.8 mmol) of n-propanol and 0.1 g (0.5 mmol) of p-toluenesulfonic acid are dissolved in 45 ml of benzene. The solution is refluxed for 22 hours using a water separator and then ether is added thereto. The mixture is subsequently neutralised with 0.1N sodium hydroxide solution. The organic phase is then washed three times with water, dried over magnesium sulfate and concentrated. The resulting oil can be purified by column chromatography (stationary phase silica gel, mobile phase hexane/ether 5/4) to yield 2.54 g (10.8 mmol, 21% of the theoretical yield) of the desired substance in the form of a clear oil.

$^1$H-NMR (CDCl$_3$, 100 MHz): $\delta$7.41/m/4H, 6.71/dd/1H, 5.89/d/1H, 5.50/s/1H, 5.23/d/1H, 3.46/m/4H, 1.62/m/4H, 0.94/t/6H.

EXAMPLE 7

Copolymerisation of 4-hydroxystyrene and 2-(4-ethenylphenyl)-1,3-dioxolane 1.8 g (10 mmol) of 2-(4-ethenylphenyl)-1,3-dioxolane and 2.4 g (20 mmol) of 4-hydroxystyrene are subjected to radical copolymerisation for 24 hours at 70° C. using 0.1 g of $\alpha,\alpha'$-azoisobutyronitrile in 17 g of freshly distilled THF. After two precipitations from 400 ml of n-hexane, the product is isolated in the form of a white powder, yield 2.5 g (60% of the theoretical yield).

$^1$H-NMR (DMSO, 300 mHz): $\delta$8.9/s, 7.3–6.9/m, 6.8–6.0/m, 5.7–5.5/m, 4.1–3.8/m, 2.0–0.9/m.

Incorporation ratio of 4-hydroxystyrene/2-(4-ethenylphenyl)-1,3-dioxolane=1:1 ($^1$H-NMR). By gel-permeation chromatography (GPC, polystyrene calibration) the following are determined: Mn=4870, Mw=12410, Mw/Mn=2.5. Tg=84° C., determined by differential scanning calorimetry, DSC (10°/min).

EXAMPLE 8

Copolymerisation of 4-hydroxystyrene and 2-(4-ethenylphenyl)-1,3-dioxolane 1.8 g (10 mmol) of 2-(4-ethenylphenyl)-1,3-dioxolane and 6.0 g (50 mmol) of 4-hydroxystyrene are copolymerised for 24 hours at 70° C. using 0.23 g of $\alpha,\alpha'$-azobisisobutyronitrile in 31 g of freshly distilled THF. The copolymer is isolated in the form of a white powder by precipitating twice from 600 ml of n-hexane; yield 5.0 g (64% of the theoretical yield).

$^1$H-NMR (CDCl$_3$, 300 MHz): $\delta$8.4/s, 7.3–6.9/m, 6.9–6.1/m, 5.8–5.7/m, 4.1–3.9/m, 2.0–0.9/m.

Incorporation ratio of 4-hydroxystyrene/2-(4-ethenylphenyl)-1,3-dioxolane=4:1 ($^1$H-NMR).

GPC (polystyrene calibration): Mn=2260, Mw=9160, Mw/Mn=4.2.

EXAMPLE 9

Copolymerisation of 4-tetrahydropyran-2-yloxystyrene with 2-(4-ethenylphenyl)-1,3-dioxolane 6.1 g (30 mmol) of 4-tetrahydropyran-α-yloxystyrene and 1.8 g (10 mmol) of 2-(4-ethenylphenyl)-1,3-dioxolane are copolymerised for 24 hours at 70° C. using 0.18 g of α,α'-azoisobutyronitrile in 32 g of toluene. After two precipitations in methanol, 4.9 g (62% of the theoretical yield) of the copolymer are obtained in the form of a white powder.

$^1$H-NMR (CDCl$_3$, 300 MHz): δ7.4–6.1/m, 5.8–5.6/bs, 5.2–5.5/bs, 4.2–3.8/m, 3.7–3.4/bs, 2.2–1.0/m.

Incorporation ratio of 4-tetrahydropyran-2-yloxystyrene/2-(4-ethenylphenyl)-1,3-dioxolane=2:1 ($^1$H-NMR).

GPC: Mn=6210, Mw=14730, Mw/Mn=2.4.

The phenol in the structural elements consisting of 4-tetrahydropyran-2-yloxystyrene is freed by stirring for 60 minutes at room temperature in tetrahydrofuran under an inert gas atmosphere in the presence of a catalytic amount of acetic acid.

EXAMPLE 10

Copolymerisation of 4-hydroxystyrene and 4-ethenylphenyl-di-n-propoxymethane In a 100 ml round-bottomed flask, 2.34 g (10 mmol) of 4-ethenylphenyl-di-n-propoxymethane, 6.0 g (50 mmol) of 4-hydroxystyrene and 0.25 g of α,α'-azoisobutyronitrile are dissolved in 33 g of tetrahydrofuran. The solution is refluxed for 24 hours and precipitation is then carried out with ten times the amount of n-hexane to yield 6.12 g (73% of the theoretical yield) of a white powder.

GPC (polystyrene calibration): Mn=2860, Mw=12940, Mw/Mn=4.5.

DSC (10°/min): Tg=51° C.

EXAMPLE 11

Copolymerisation of 4-hydroxystyrene with 4-(2-ethenylphenyl-1,3,5,5-dimethyldioxane In a 100 ml round-bottomed flask, 2.18 g (10 mmol) of 4-(2-ethenylphenyl-1,3,5,5-dimethyldioxane, 6.0 g (50 mmol) of 4-hydroxystyrene and 0.25 g of α,α'-azoisobutyronitrile are dissolved in 32 g of tetrahydrofuran. After boiling under reflux for 24 hours, precipitation is carried out from n-hexane, the resulting white powder is dissolved in tetrahydrofuran and precipitation is again carried out from ten times the amount of n-hexane to yield 5.5 g (67% of the theoretical yield) of a white powder.

GPC (polystyrene calibration): Mn=5480, Mw=13410, Mw/Mn=2.4.

DSC (10°/min): Tg=53° C.

H-NMR (acetone-d$_6$, 100 MHz): δ8.0, 7.3, 6.6, 5.4, 3.7, 2.1-1.1, 1.3.

Incorporation ratio of 4-(2-ethenylphenyl)-1,3,5,5-dimethyldioxane/4-hydroxystyrene=1:3 (determined by $^1$H-NMR-spectroscopy).

EXAMPLE 12

A resist mixture is prepared by dissolving 90 parts by weight of the copolymer according to Example 7 and 10 parts by weight of triphenylsulfonium trifluoromethanesulfonate in 350 parts by weight of cyclopentanone. This mixture is spin-coated onto a silicon wafer and dried at 120° C. for 2 minutes to produce a resist film having a coating thickness of 1.0 μm which is subsequently exposed image-wise through a quartz mask. The light source used is a mercury vapour lamp which remains switched on for 3 seconds. After exposure, heating is carried out at 90° C. for 3 minutes and then developing is carried out in a solution of 15% by weight tetramethylammonium hydroxide in water. The exposed areas of the film are retained in the form of relief structures of the original thickness while the unexposed areas are dissolved. The resulting resist material permits the resolution of submicron structures.

EXAMPLE 13

A resist solution is prepared by dissolving 96 parts by weight of the copolymer according to Example 8 and 5 parts by weight of triphenylsulfonium trifluoromethanesulfonate in 250 parts by weight of cyclohexanone. The solution is spin-coated onto a silicon wafer and is then dried at 120° C. for 2 minutes to produce a resist film of 1.1 μm thickness. The optical density of that film, measured on a quartz wafer, has at 248 nm a value of 0.32. The wafer coated with the resist film is then contact-exposed through a quartz mask with an interference narrow band filter at 254 nm and at a dose of 20 mJ/cm$^2$ and is subsequently heated at 120° C. for 1 minute. Upon subsequently developing in a 2.38% by weight aqueous solution of tetramethylammonium hydroxide, the exposed areas of the film remain behind in the form of relief structures of the original thickness while the unexposed areas are dissolved. The resulting resist material is capable of reproducing, at a contrast value γ of 3.0, structures down to 0.5 micrometers l/s (lines and spaces) true to line and without swelling.

EXAMPLE 14

The resist solution obtained in accordance with Example 11 is applied by brushing to a copper-clad circuit board and drying is carried out at 100° C. for 15 minutes in a hot oven to produce resist films having a coating thickness of 15 μm. Exposure is then carried out for 15 seconds through a mask using a mercury vapour lamp, and the board is then kept at 120° C. for 2 minutes. Developing is subsequently carried out in a 2.38% by weight solution of tetramethylammonium hydroxide in water for 1 minute, the exposed areas of the resist film remaining behind and the unexposed areas being dissolved.

What is claimed is:

1. A copolymer having a molecular weight (Mw) of from 10$^3$ to 10$^6$, measured by gel-permeation chromatography, that is crosslinkable by acid catalysis and that consists of a) 100–80 mol. % of structural repeating units of formulae I and II

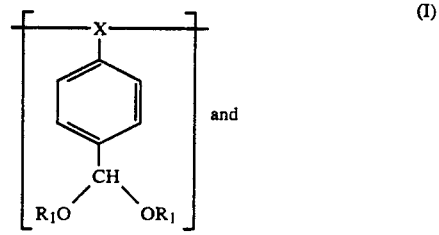

-continued

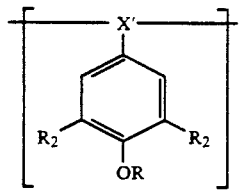 (II)

in a ratio of from 1:1 to 1:9 and b) 0–20 mol. % of structural repeating units of formula III

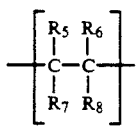 (III)

wherein X and X' each independently of the other are

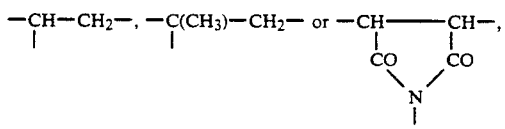

R is hydrogen or a protecting group that can be removed by the action of acids, the radicals $R_1$ each independently of the other are $C_1$-$C_5$alkyl, phenyl or naphthyl or together are 1,2-phenylene or —[C($R_3$)($R_4$)]$_x$— wherein $R_3$ and $R_4$ independently are hydrogen or methyl and x is from 2 to 5, the radicals $R_2$ each independently of the other are hydrogen, $C_1$-$C_5$alkyl or $C_1$-$C_5$alkoxy, $R_5$ and $R_7$ are each hydrogen, $R_6$ is hydrogen, halogen or methyl and $R_8$ is hydrogen, halogen, methyl, —CH$_2$halogen, —CH$_2$CN, —CN, —COOH, —CONH$_2$, —O—$C_1$-$C_5$alkyl, —O—CO—$C_1$-$C_5$alkyl, —COO—$C_1$-$C_5$alkyl, —COO-phenyl or phenyl, or $R_5$ and $R_6$ are each hydrogen and $R_7$ and $R_8$ together are —CO—O—CO— or each independently of the other are —COOH or —COO—$C_1$-$C_5$alkyl.

2. A copolymer according to claim 1 which consists of from 100 to 90 mol. % of structural repeating units of formulae I and II and from 0 to 10 mol. % of structural repeating units of formula III.

3. A copolymer according to claim 1, wherein X and X' are

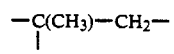

or, are each

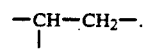

4. A copolymer according to claim 1, wherein the radicals $R_1$ together are —[C($R_3$)($R_4$)]$_x$— and the radicals $R_2$ are each hydrogen, methyl, ethyl, methoxy or ethoxy.

5. A copolymer according to claim 1, wherein R is a radical of formula IV, V, VI or VII

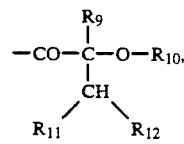 (IV)

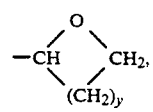 (V)

—COO—C(CH$_3$)$_3$ (VI) or —CO—$R_{13}$ (VII), wherein $R_9$ is hydrogen or methyl, $R_{10}$ is $C_1$-$C_5$alkyl, phenyl or naphthyl and $R_{11}$ and $R_{12}$ each independently of the other are hydrogen, $C_1$-$C_5$alkyl, phenyl or naphthyl, or $R_{10}$ and $R_{12}$ together are ethylene, propylene or butylene each unsubstituted or substituted by $C_1$-$C_4$alkyl, $C_1$-$C_4$alkoxy, phenyl, naphthyl, phenoxy or by naphthyloxy, y is 2, 3 or 4, and $R_{13}$ is $C_1$-$C_5$alkyl or $C_1$-$C_5$alkoxy.

6. A copolymer according to claim 5, wherein R is —COO—C(CH$_3$)$_3$ or a radical of formula V wherein y is 2 or 3.

7. A copolymer according to claim 1, wherein X and X are

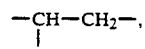

R and the two radicals $R_2$ are each hydrogen and the radicals $R_1$ together are —[C($R_3$)($R_4$)]$_x$— wherein x=from 2 to 4.

* * * * *